United States Patent
Takizawa et al.

(10) Patent No.: US 10,777,925 B2
(45) Date of Patent: Sep. 15, 2020

(54) CONNECTOR AND STACKED SUBSTRATE MODULE

(71) Applicant: Toshiba Electronic Devices & Storage Corporation, Minato-ku, Tokyo (JP)

(72) Inventors: Minoru Takizawa, Sagamihara Kanagawa (JP); Kenichi Agawa, Yokohama Kanagawa (JP)

(73) Assignee: Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/292,505

(22) Filed: Mar. 5, 2019

(65) Prior Publication Data
US 2020/0067220 A1 Feb. 27, 2020

(30) Foreign Application Priority Data
Aug. 21, 2018 (JP) ................. 2018-154779

(51) Int. Cl.
*H01R 12/73* (2011.01)
*H01R 12/70* (2011.01)
*H05K 1/14* (2006.01)

(52) U.S. Cl.
CPC ......... *H01R 12/73* (2013.01); *H01R 12/7047* (2013.01); *H05K 1/144* (2013.01); *H05K 2201/042* (2013.01); *H05K 2201/10189* (2013.01); *H05K 2201/10409* (2013.01)

(58) Field of Classification Search
CPC .... H01R 12/73; H01R 12/7074; H05K 1/144; H05K 2201/042; H05K 2201/10189; H05K 2201/10409

USPC .............................. 439/74, 66, 65
See application file for complete search history.

(56) References Cited

U.S. PATENT DOCUMENTS

| | | | | |
|---|---|---|---|---|
| 5,167,512 A | * | 12/1992 | Walkup | H01R 13/2421 439/65 |
| 5,324,205 A | * | 6/1994 | Ahmad | H01R 12/714 439/66 |
| 5,427,535 A | * | 6/1995 | Sinclair | H01R 13/2414 439/66 |
| 5,473,510 A | * | 12/1995 | Dozier, II | H01L 23/4006 174/548 |
| 5,791,914 A | * | 8/1998 | Loranger | H01R 13/24 439/66 |
| 5,800,184 A | * | 9/1998 | Lopergolo | H05K 7/1069 439/591 |
| 5,806,181 A | * | 9/1998 | Khandros | H01R 43/16 29/840 |

(Continued)

FOREIGN PATENT DOCUMENTS

| | | |
|---|---|---|
| JP | H11-45768 A | 2/1999 |
| JP | 2002-33171 A | 1/2002 |

(Continued)

*Primary Examiner* — Harshad C Patel
(74) *Attorney, Agent, or Firm* — White & Case LLP

(57) ABSTRACT

According to one embodiment, a connector includes an insulating material part, and a plurality of first through conductive parts surrounded with the insulating material part, penetrating the insulating material part in a first direction, and arranged in a second direction perpendicular to the first direction, wherein each of the first through conductive parts includes a single bent portion, and the first through conductive parts are bent in the same direction.

12 Claims, 7 Drawing Sheets

(56) References Cited

U.S. PATENT DOCUMENTS

| | | | | |
|---|---|---|---|---|
| 6,409,521 | B1* | 6/2002 | Rathburn | H01R 13/2435 439/66 |
| 7,358,603 | B2* | 4/2008 | Li | G01R 31/2886 257/697 |
| 7,435,102 | B2* | 10/2008 | Goodman | H01R 13/2421 361/813 |
| 7,654,827 | B2* | 2/2010 | Arai | H01R 13/2414 439/65 |
| 7,690,925 | B2* | 4/2010 | Goodman | H05K 7/1061 361/813 |
| 7,845,955 | B2* | 12/2010 | Nakayama | G01R 1/07371 439/66 |
| 7,891,983 | B2* | 2/2011 | Ichimura | H01R 13/2428 439/66 |
| 8,133,061 | B1* | 3/2012 | Ayers, Sr. | H01R 12/714 439/66 |
| 9,184,145 | B2* | 11/2015 | Rathburn | H01R 12/7076 |
| 9,276,339 | B2* | 3/2016 | Rathburn | H01R 11/16 |
| 9,318,862 | B2* | 4/2016 | Rathburn | H01R 43/18 |
| 9,320,133 | B2* | 4/2016 | Rathburn | H01R 43/0256 |
| 9,689,897 | B2* | 6/2017 | Rathburn | G01R 1/0466 |
| 2005/0208811 | A1 | 9/2005 | Okamoto et al. | |
| 2006/0141815 | A1* | 6/2006 | Li | H01R 13/2407 439/66 |

FOREIGN PATENT DOCUMENTS

| | | |
|---|---|---|
| JP | 2002-56908 A | 2/2002 |
| JP | 2002-75567 A | 3/2002 |
| JP | 2005-302705 A | 10/2005 |
| JP | 2007-66575 A | 3/2007 |

* cited by examiner

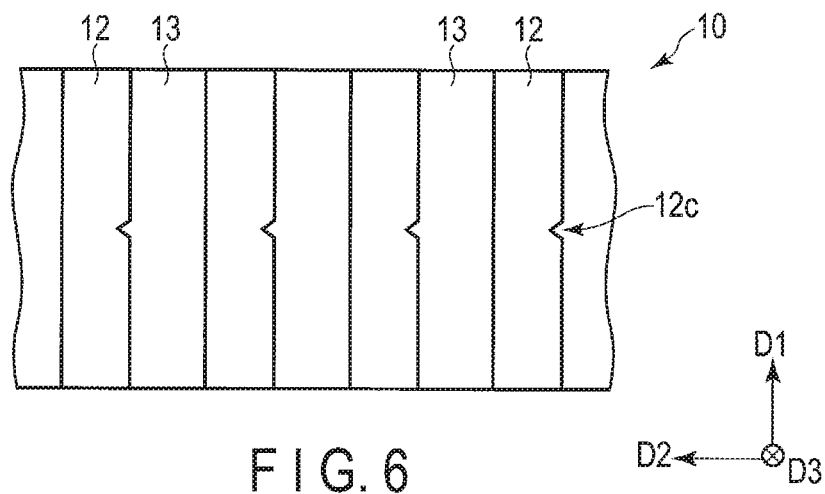
F I G. 6
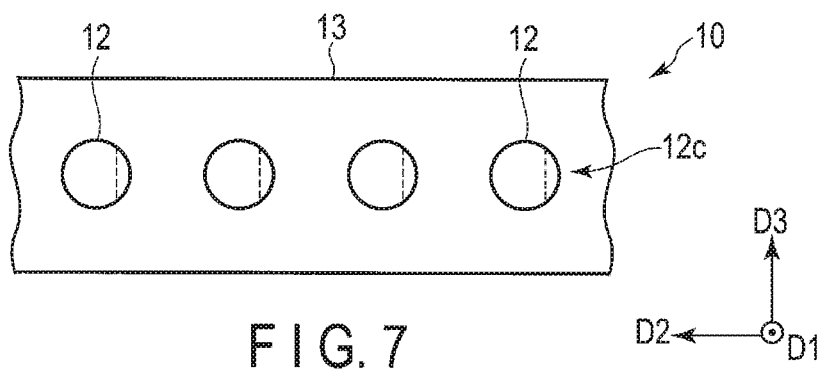
F I G. 7
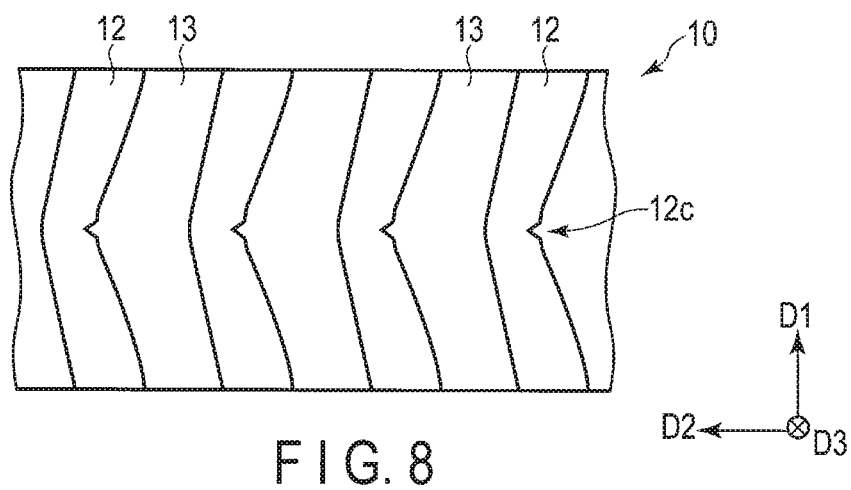
F I G. 8

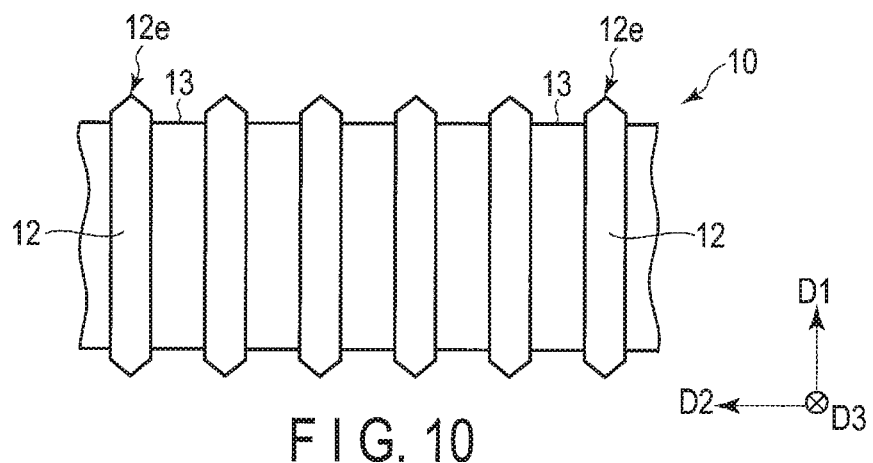
F I G. 10
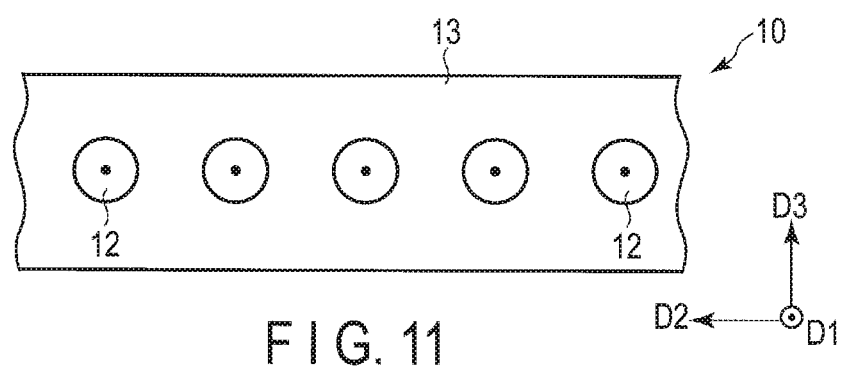
F I G. 11
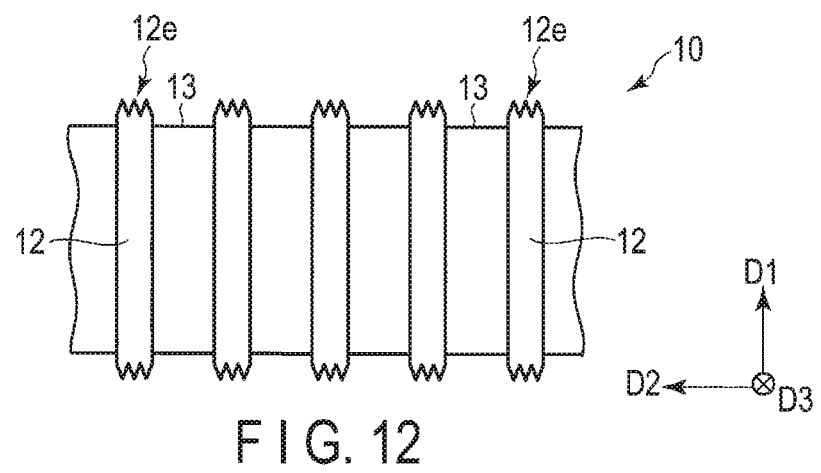
F I G. 12

CONNECTOR AND STACKED SUBSTRATE MODULE

CROSS-REFERENCE TO RELATED APPLICATIONS

This application is based upon and claims the benefit of priority from Japanese Patent Application No. 2018-154779, filed Aug. 21, 2018, the entire contents of which are incorporated herein by reference.

FIELD

Embodiments described herein relate generally to a connector and stacked substrate module.

BACKGROUND

A stacked substrate module formed by stacking a plurality of small printed substrates is proposed. In this stacked substrate module, small printed substrates adjacent to each other are connected to each other through a connector.

However, with the conventional connector and stacked substrate module, it has not always been safely said that satisfactory connection has been achieved.

BRIEF DESCRIPTION OF THE DRAWINGS

FIG. 6 is a cross-sectional view schematically showing a configuration example of a connector according to a second embodiment.

FIG. 7 is a plan view schematically showing the configuration example of the connector according to the second embodiment.

FIG. 8 is a cross-sectional view schematically showing a state of the connector where a stacked substrate module is assembled by using the connector according to the second embodiment.

FIG. 10 is a cross-sectional view schematically showing a first configuration example of a connector according to a third embodiment.

FIG. 11 is a plan view schematically showing the first configuration example of the connector according to the third embodiment.

FIG. 12 is a cross-sectional view schematically showing a second configuration example of the connector according to the third embodiment.

DETAILED DESCRIPTION

In general, according to one embodiment, a connector includes: an insulating material part; and a plurality of first through conductive parts surrounded with the insulating material part, penetrating the insulating material part in a first direction, and arranged in a second direction perpendicular to the first direction, wherein each of the first through conductive parts includes a single bent portion, and the first through conductive parts are bent in the same direction.

Hereinafter, embodiments will be described with reference to the accompanying drawings.

Embodiment 1

Figure 1:
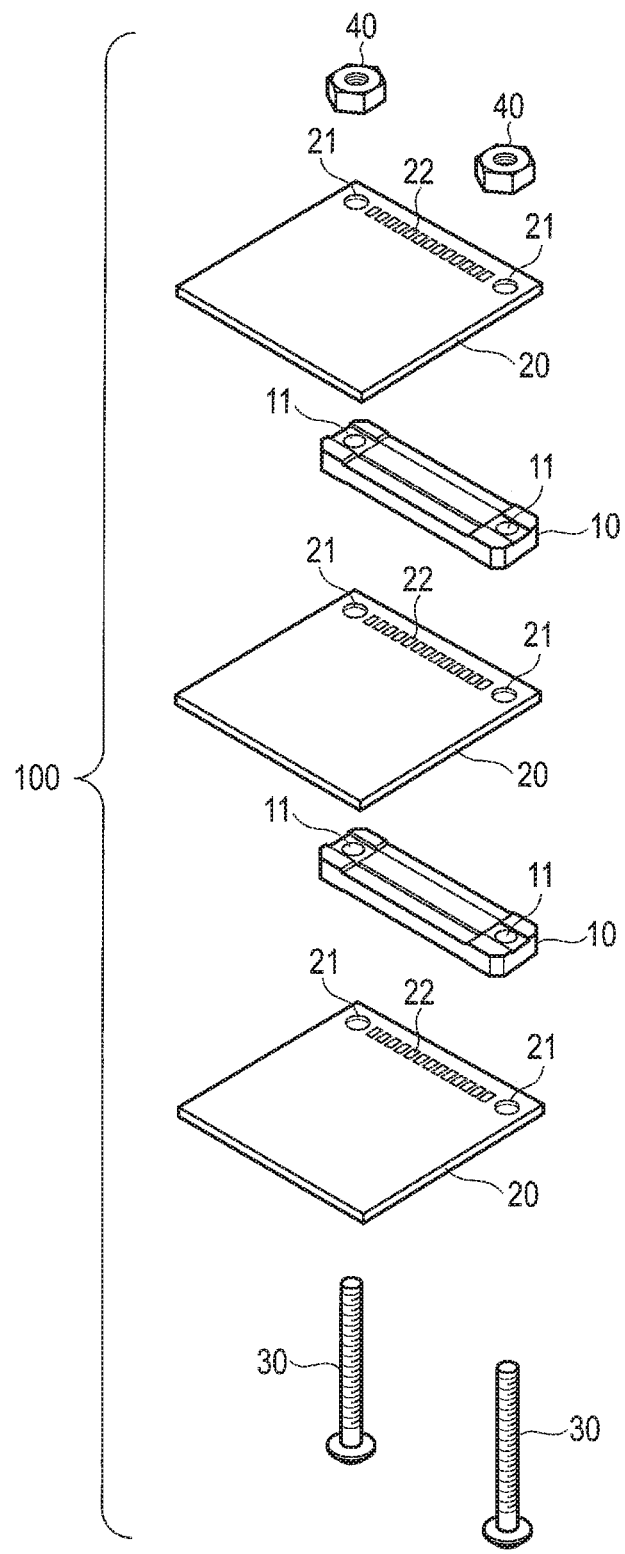
FIG. 1 is a view schematically showing a state where a stacked substrate module using a connector according to a first, second or third embodiment is disassembled.

FIG. 1 is a view schematically showing a state where a stacked substrate module using a connector according to this embodiment is disassembled.

A stacked substrate module 100 is constituted of one or more connectors 10, and two or more substrates (printed substrates) 20. In the example shown in FIG. 1, the stacked substrate module 100 is constituted of two connectors 10, and three substrates 20. More specifically, bolts 30 are passed through screw holes 11 provided in the connectors 10 and holes 21 provided in the substrates 20 and the bolts 30 are fixed by means of nuts 40, whereby the stacked substrate module 100 can be obtained.

The connector 10 is provided with a plurality of through conductive parts (not shown), and the substrate (printed-substrate) 20 is provided with a plurality of electrodes 22 in such a manner as to be correspondent to the plurality of through conductive parts. Electrodes 22 provided in the adjacent substrates 20 are connected to each other through the through conductive parts provided in the connectors 10.

On the substrates 20, electronic components, printed wiring, and the like are provided. In the category of the substrate 20, for example, a substrate for a power source (battery), substrate for a sensor, substrate for a controller, and the like are included.

Figure 2:
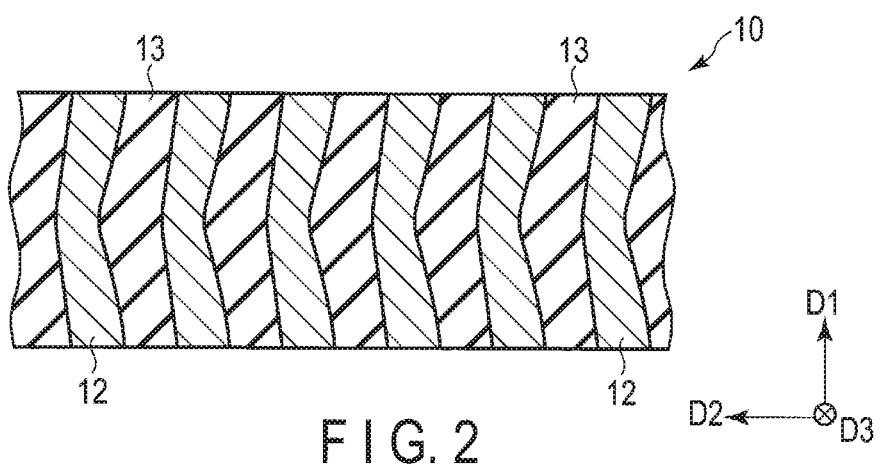
FIG. 2 is a cross-sectional view schematically showing a configuration example of a connector according to a first embodiment.
Figure 3:
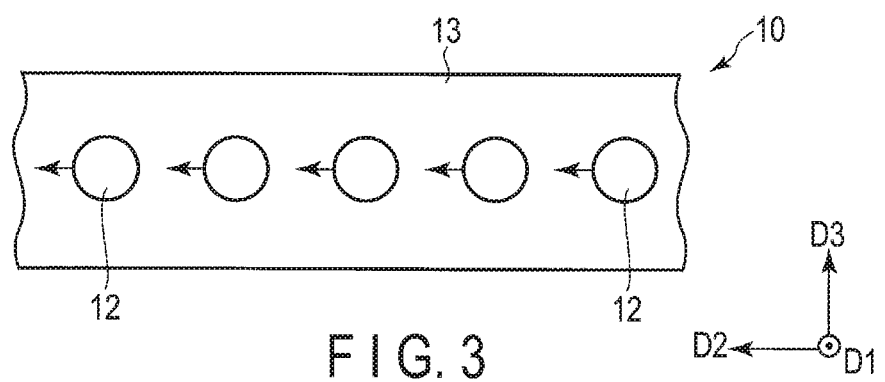
FIG. 3 is a plan view schematically showing the configuration example of the connector according to the first embodiment.

FIG. 2 is a cross-sectional view schematically showing a configuration example of the connector 10 according to this embodiment. FIG. 3 is a plan view schematically showing the configuration example of the connector 10 according to this embodiment.

The connector 10 includes a plurality of through conductive parts (first through conductive parts) 12, and insulating material part 13.

The plurality of through conductive parts 12 are formed of a metallic material such as brass, nickel titanium (NiTi) or the like, and is surrounded with the insulating material part 13. The plurality of through conductive parts 12 penetrate the insulating material part 13 in a first direction D1, and are arranged in a second direction D2 perpendicular to the first direction D1. All the first through conductive parts 12 are bent in the same direction. More specifically, the through conductive parts 12 are bent in the second direction D2. Further, each of the through conductive parts 12 includes a single bent portion.

The insulating material part 13 is formed of an elastic insulating material. More specifically, as the material for the insulating material part 13, rubber is used.

Figure 4:
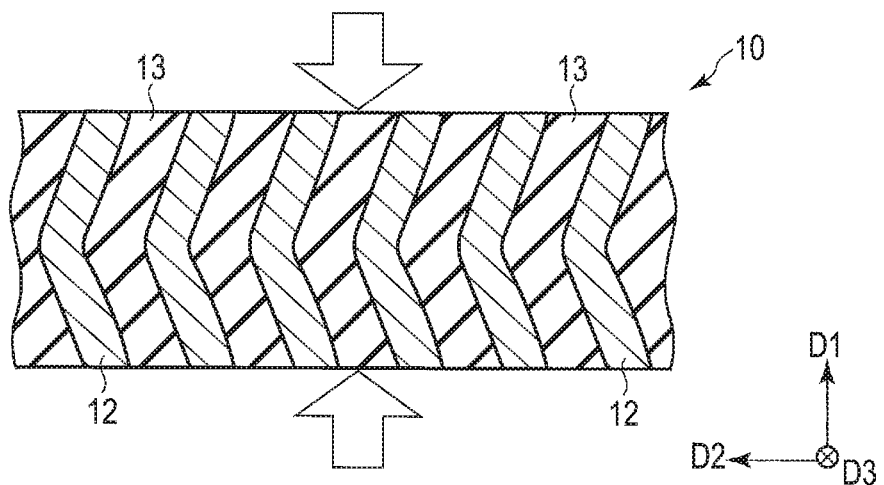
FIG. 4 is a cross-sectional view schematically showing a state of the connector where a stacked substrate module is assembled by using the connector according to the first embodiment.

FIG. 4 is a cross-sectional view schematically showing a state of the connector where a stacked substrate module shown in FIG. 1 is assembled by using the connector shown in FIG. 2 and FIG. 3. When the stacked substrate module 100 is assembled, the connector 10 is subjected to pressure in the first direction by the substrates 20 on both sides. In this embodiment, the through conductive parts 12 inside the connector 10 are bent in advance in the same direction (second direction D2). Accordingly, when the pressure in the first direction is applied to the through conductive parts 12, all the through conductive parts are bent in the same direction (second direction D2).

Assuming that the through conductive parts 12 are not bent in advance and straight through conductive parts 12 are provided, when the force in the first direction D1 is applied to the connector 10, the through conductive parts are bent in random directions. When the through conductive parts 12 are bent in the random directions as described above, distances between adjacent through conductive parts 12 become smaller, and there is a fear of occurrence of an electric short circuit between adjacent through conductive parts 12. Accordingly, there is a fear that a connector 10 excellent in reliability may not be obtained.

In this embodiment, each of the plurality of through conductive parts 12 has a single bent portion, and the plurality of through conductive parts 12 are bent in advance in the same direction (second direction), and hence, when the force in the first direction D1 is applied to the connector 10, the through conductive parts 12 are bent in the same direction (second direction). Accordingly, it is possible to prevent the aforementioned problem from occurring and obtain a connector 10 excellent in reliability.

It should be noted that in the embodiment described above, although the through conductive parts 12 are bent in advance in the second direction D2, if only the through conductive parts 12 are bent in the same direction, the direction in which the through conductive parts 12 are bent may not necessarily be the second direction D2. For example, the through conductive parts 12 may be bent in advance in a third direction D3 perpendicular to both the first direction D1 and second direction D2.

Figure 5A:
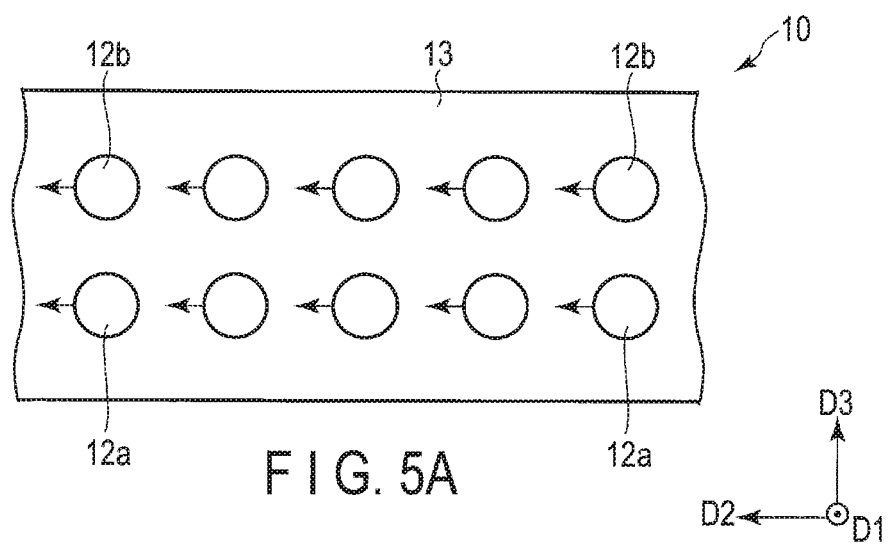
FIG. 5A is a plan view schematically showing a first configuration example of a connector according to a modification example of the first embodiment.

FIG. 5A is a plan view schematically showing a first configuration example of a connector 10 according to a modification example of this embodiment.

In the embodiment described above, although the through conductive parts 12 are arranged in one line, in this modification example, the through conductive parts 12 are arranged in two lines. That is, in this modification example, the connector 10 includes a plurality of first through conductive parts 12a arranged in the second direction D2, and a plurality of second through conductive parts 12b arranged in the second direction D2. As in the case of the aforementioned embodiment, the first through conductive parts 12a and second through conductive parts 12b are surrounded with an insulating material part 13 formed of an elastic insulating material (for example, rubber), and penetrate the insulating material part 13 in the first direction D1.

In the first configuration example shown in FIG. 5A, all the plurality of first through conductive parts 12a are bent in the same direction (second direction D2, i.e., direction indicated by arrows) and, all the plurality of second through conductive parts 12b are bent in the same direction (second direction D2, i.e., direction indicated by arrows). Further, in this configuration example, the bending direction of the first through conductive parts 12a and bending direction of the second through conductive parts 12b are identical to each other.

Figure 5B:
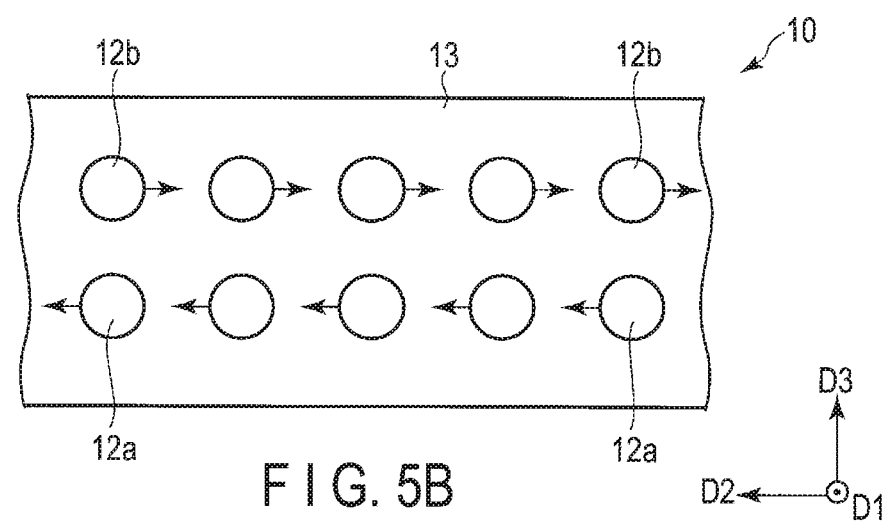
FIG. 5B is a plan view schematically showing a second configuration example of the connector according to the modification example of the first embodiment.

FIG. 5B is a plan view schematically showing a second configuration example of the connector 10 according to this modification example. In this configuration example, all the plurality of first through conductive parts 12a are bent in the same direction (second direction D2) and, all the plurality of second through conductive parts 12b are bent in the same direction (direction opposite to the second direction D2). As described above, in this configuration example, the bending direction of the first through conductive parts 12a and bending direction of the second through conductive parts 12b are exactly opposite to each other.

Figure 5C:
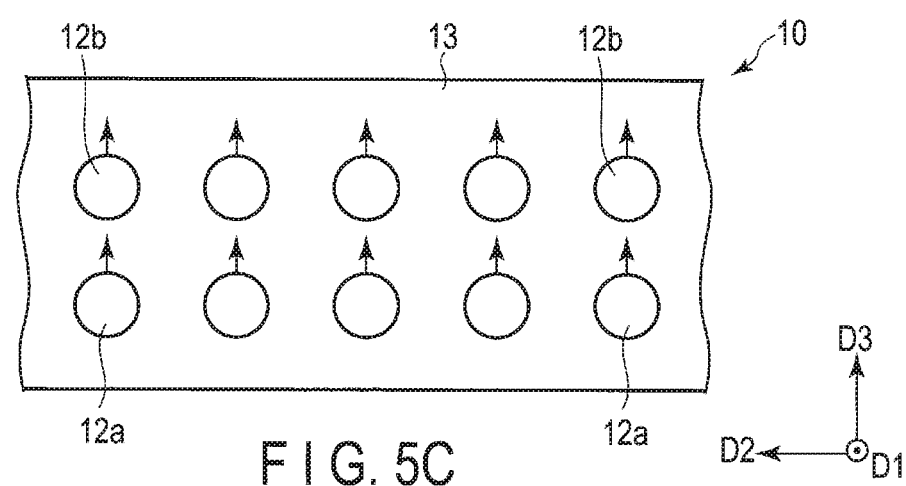
FIG. 5C is a plan view schematically showing a third configuration example of the connector according to the modification example of the first embodiment.

FIG. 5C is a plan view schematically showing a third configuration example of the connector 10 according to this modification example. In the first configuration example and second configuration example described above, although the through conductive parts are bent in the same direction in the same line in the major axis direction (direction in which the arranged number of the through conductive parts is larger) of the connector 10, in this configuration example, the through conductive parts are bent in the same direction in the minor axis direction (direction in which the arranged number of the through conductive parts is smaller) of the connector 10. Specifically, in this modification example, the first through conductive parts 12a and second through conductive parts 12b are bent in the third direction D3 perpendicular to both the first direction D1 and second direction D2.

In this modification example exemplified in the first to third configuration examples, the through conductive part arranged in the same line are bent in advance in the same direction. Accordingly, it is possible to prevent the aforementioned problem from occurring and obtain a connector 10 excellent in reliability.

It should be noted that in the modification example described above, although the case where the number of lines in the major axis direction of the connector 10 is two is shown, the number of lines in the major axis direction may be three or more.

Embodiment 2

Next, a second embodiment will be described below. It should be noted that the fundamental items are identical to the first embodiment, and hence descriptions of the items already described in the first embodiment are omitted.

FIG. 6 is a cross-sectional view (cross-sectional view viewed from the third direction D3) schematically showing a configuration example of a connector 10 according to this embodiment. FIG. 7 is a plan view (plan view viewed from the first direction D1) schematically showing the configuration example of the connector 10 according to this embodiment.

As in the case of the first embodiment, in this embodiment too, the connector 10 includes a plurality of through conductive parts (first through conductive parts) 12 and insulating material part 13.

As in the case of the first embodiment, the plurality of through conductive parts 12 are surrounded with the insulating material part 13, penetrate the insulating material part 13 in the first direction D1, and are arranged in the second direction D2 perpendicular to the first direction D1.

In this embodiment, the plurality of through conductive parts 12 include notch portions 12c configured to bend the through conductive parts 12 in the same direction. Specifically, all the through conductive parts 12 include notch portions 12c configured to bend all the through conductive parts 12 in the second direction D2. To be more specific, the plurality of through conductive parts 12 each include notch portions 12c at positions correspondent to each other. That is, the plurality of through conductive parts 12 include the notch portions 12c at positions correspondent to each other when viewed from the third direction D3 as shown in FIG. 6, and at positions correspondent to each other when viewed from the first direction D1 as shown in FIG. 7.

FIG. 8 is a cross-sectional view schematically showing a state of the connector 10 where a stacked substrate module 100 is assembled by using the connector 10 shown in FIG. 6 and FIG. 7. As already described previously, when the stacked substrate module 100 is assembled, the connector 10 is subjected to pressure in the first direction by the substrates 20 on both sides. In this embodiment, the plurality of through conductive parts 12 inside the connector 10 include notch portions 12c at positions correspondent to each other. Accordingly, when the force in the first direction is applied to the through conductive parts 12, all the through conductive parts 12 are bent in the same direction (second direction D2).

Accordingly, in this embodiment too, it is possible to prevent the problem described in the first embodiment from occurring and obtain a connector 10 excellent in reliability.

It should be noted that in the embodiment described above, although the notch portions 12c are provided in such a manner that the plurality of through conductive parts 12 are bent in the second direction D2, it is sufficient if the notch portions 12c are provided in such a manner that the plurality of through conductive parts 12 are bent in the same direction. For example, the notch portions 12c may also be provided in such a manner that the through conductive parts 12 are bent in the third direction D3 perpendicular to both the first direction D1 and second direction D2.

Figure 9A:
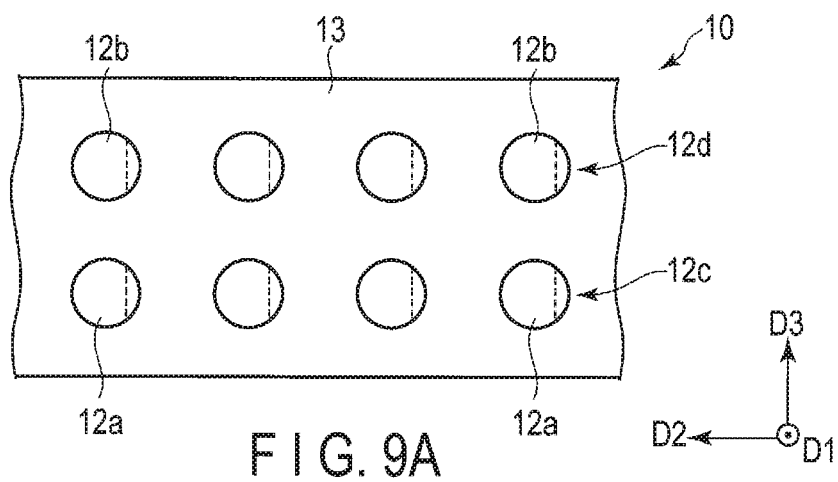
FIG. 9A is a plan view schematically showing a first configuration example of a connector according to a modification example of the second embodiment.

FIG. 9A is a plan view schematically showing a first configuration example of a connector 10 according to a modification example of this embodiment.

In the embodiment described above, although the through conductive parts 12 are arranged in one line, in this modification example, the through conductive parts 12 are arranged in two lines. That is, in this modification example, the connector 10 includes a plurality of first through conductive parts 12a arranged in the second direction D2, and a plurality of second through conductive parts 12b arranged in the second direction D2. As in the case of the embodiment described above, the first through conductive parts 12a and second through conductive parts 12b are surrounded with the insulating material part 13, and penetrate the insulating material part 13 in the first direction D1.

In the first configuration example shown in FIG. 9A, the first through conductive parts 12a include notch portions 12c at positions correspondent to each other in such a manner that all the plurality of first through conductive parts 12a are bent in the same direction (second direction D2). Further, the second through conductive parts 12b include notch portions 12d at positions correspondent to each other in such a manner that all the plurality of second through conductive parts 12b are bent in the same direction (second direction D2). Further, the first notch portions 12c and second notch portions 12d are provided in such a manner that the bending direction of the first through conductive parts 12a and bending direction of the second through conductive parts 12b become identical to each other.

Figure 9B:
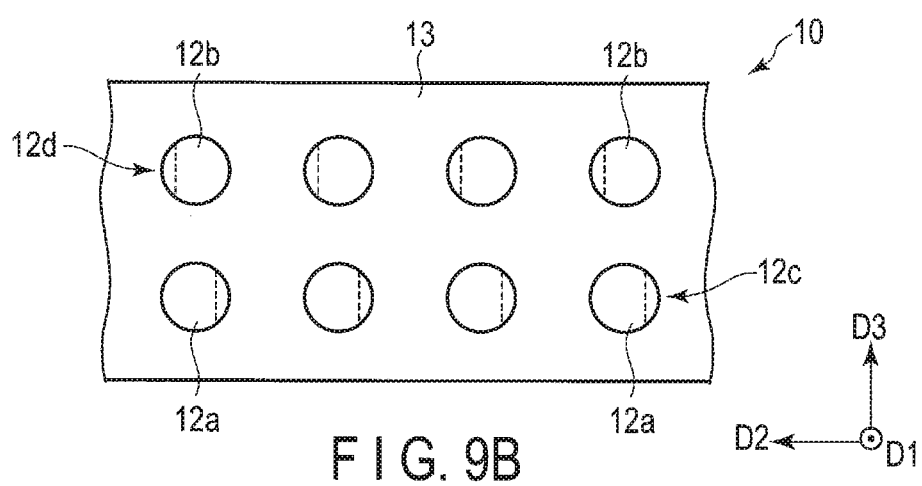
FIG. 9B is a plan view schematically showing a second configuration example of the connector according to the modification example of the second embodiment.

FIG. 9B is a plan view schematically showing a second configuration example of the connector 10 according to this modification example.

In this configuration example too, the first through conductive parts 12a include first notch portions 12c at positions correspondent to each other in such a manner that all the plurality of first through conductive parts 12a are bent in the same direction (second direction D2). Further, the second through conductive parts 12b include second notch portions 12d at positions correspondent to each other in such a manner that all the plurality of second through conductive parts 12b are bent in the same direction (direction opposite to the second direction D2). As described above, in this configuration example, the first notch portions 12c and second notch portions 12d are provided in such a manner that the bending direction of the first through conductive parts 12a and bending direction of the second through conductive parts 12b become exactly opposite to each other.

Figure 9C:
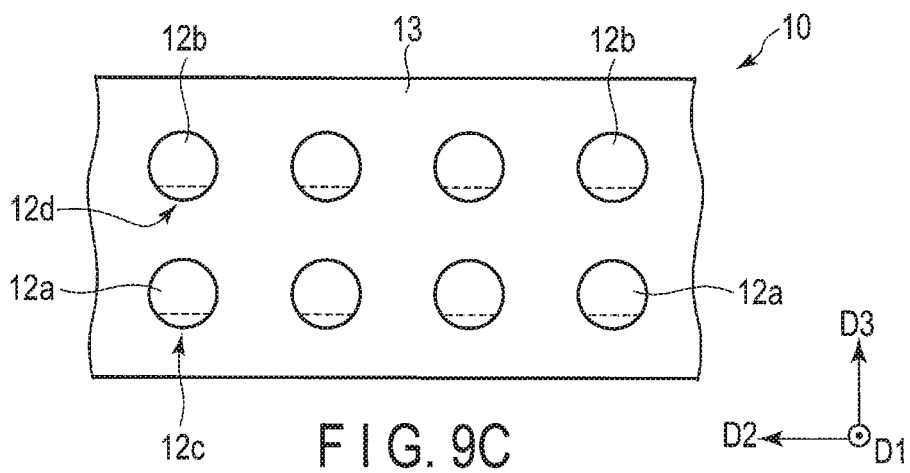
FIG. 9C is a plan view schematically showing a third configuration example of the connector according to the modification example of the second embodiment.

FIG. 9C is a plan view schematically showing a third configuration example of the connector 10 according to this modification example. In the first configuration example and second configuration example described above, although the first notch portions 12c and second notch portions 12d are provided in such a manner that the through conductive parts are bent in the same direction in the same line in the major axis direction (direction in which the arranged number of the through conductive parts is larger) of the connector 10, in this configuration example, the first notch portions 12c and second notch portions 12d are provided in such a manner that the through conductive parts are bent in the same direction in the same line in the minor axis direction (direction in which the arranged number of the through conductive parts is smaller) of the connector 10. That is, in this modification example, the first notch portions 12c and second notch portions 12d are provided in such a manner that the first through conductive parts 12a and second through conductive parts 12b are bent in the third direction D3 perpendicular to both the first direction D1 and second direction D2.

Also in this modification example exemplified in the first to third configuration examples described above, the first notch portions 12c and second notch portions 12d are provided in such a manner that the through conductive parts arranged in the same line are bent in the same direction. Accordingly, it is possible to prevent the problem described in the first embodiment from occurring and obtain a connector 10 excellent in reliability.

It should be noted that in the modification example described above, although the case where the number of lines in the major axis of the connector 10 is two is shown, the number of lines in the major axis may also be three or more.

Embodiment 3

Next, a third embodiment will be described below.

It should be noted that the fundamental items are identical to the first embodiment, and hence descriptions of the items already described in the first embodiment are omitted.

FIG. 10 is a cross-sectional view (cross-sectional view viewed from the third direction D3) schematically showing a first configuration example of a connector 10 according to this embodiment. FIG. 11 is a plan view (plan view viewed from the first direction D1) schematically showing the first configuration example of the connector 10 according to this embodiment.

As in the case of the first embodiment, in this embodiment too, the connector 10 includes a plurality of through conductive parts 12 and insulating material part 13.

As in the case of the first embodiment, the plurality of through conductive parts 12 are surrounded with the insulating material part 13, penetrate the insulating material part 13 in the first direction D1, and are arranged in the second direction D2 perpendicular to the first direction D1.

In this embodiment, each of the plurality of through conductive parts 12 of the connector 10 includes a projecting portion 12e projecting from the insulating material part 13. The projecting portion 12e includes at least one tapered shape part (first portion) formed in such a manner as to be made gradually thinner in the projecting direction (first direction D1). As shown in FIG. 10 and FIG. 11, in this configuration example, only one tapered shape part is provided.

By virtue of such a configuration, in this embodiment, when the stacked substrate module 100 shown in FIG. 1 is assembled, it is possible to securely connect the electrode 22 provided in the substrate 20 and through conductive part 12 to each other. Accordingly, in this embodiment, it is possible to obtain a connector enabling acquisition of satisfactory connection. Hereinafter, a description of the connector will be given.

When an insulating film (for example, naturally oxidized film or the like) is formed on the surface of the electrode 22 provided in the substrate 20, there is a fear that the electrode 22 and through conductive part 12 cannot securely be connected to each other. In this embodiment, the projecting portion 12e of the through conductive part 12 includes the tapered shape part formed gradually thinner in the projecting direction. Accordingly, this tapered shape part penetrates the insulating film formed on the surface of the electrode 22, whereby it is possible to securely connect the electrode 22 and through conductive part 12 to each other.

Figure 13:
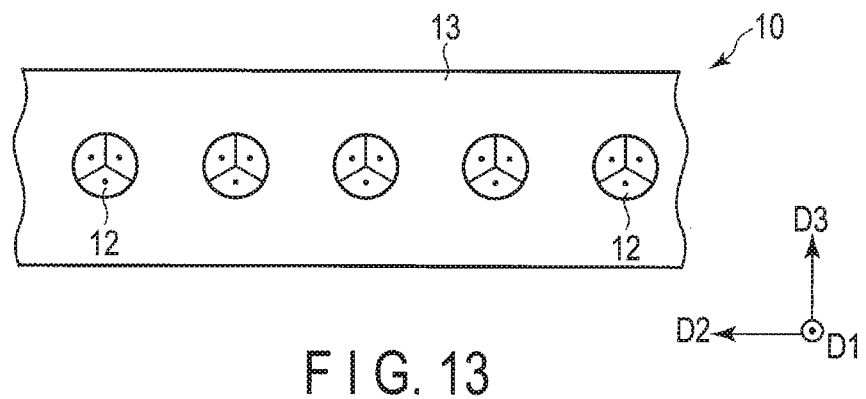
FIG. 13 is a plan view schematically showing the second configuration example of the connector according to the third embodiment.

FIG. 12 is a cross-sectional view (cross-sectional view viewed from the third direction D3) schematically showing a second configuration example of the connector 10 according to this embodiment. FIG. 13 is a plan view (plan view viewed from the first direction D1) schematically showing the second configuration example of the connector 10 according to this embodiment.

In this configuration example, the projecting portion 12e of the through conductive part 12 includes a plurality of tapered shape parts (first portions). In the example shown in FIG. 12 and FIG. 13, although the number of the tapered shape parts is three, the number of the tapered shape parts may be two or four or more.

Tips of the plurality of tapered shape parts of the projecting portion 12e are of the same height. Further, the projecting portion 12e has n-fold rotational symmetry (where n is an integer greater than or equal to 2) when viewed from the direction parallel to the projecting direction (first direction D1). In the example, shown in FIG. 12 and FIG. 13, the projecting portion 12e has 3-fold rotational symmetry when viewed from the direction parallel to the projecting direction.

As in the case of the first configuration example, in this configuration example too, it is possible to securely connect the electrode 22 provided in the substrate 20 and through conductive part 12 to each other. Accordingly, in this configuration example too, it is possible to obtain a connector 10 enabling acquisition of satisfactory connection. Further, in this configuration example, the projecting portion 12e includes a plurality of tapered shape parts, and hence, by virtue of the plurality of tapered shape parts, it is possible to more securely connect the electrode 22 and through conductive part 12 to each other.

Figure 14:
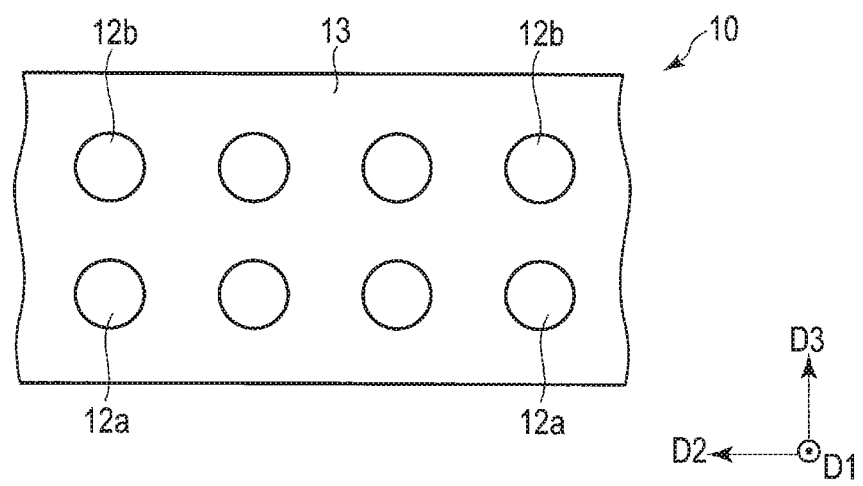
FIG. 14 is a plan view schematically showing the configuration of a modification example of the connector according to the third embodiment.

It should be noticed that as in the cases of the first embodiment and second embodiment, in this embodiment too, the number of lines in the major axis of the connector 10 may also be plural. For example, as shown in FIG. 14, the connector 10 may be constituted of a plurality of first through conductive parts 12a arranged in the second direction D2 and a plurality of second through conductive parts 12b arranged in the second direction D2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A connector comprising:
an insulating material; and
a plurality of first through conductors surrounded with the insulating material, penetrating the insulating material in a first direction, and arranged in a second direction perpendicular to the first direction, wherein
each of the first through conductors configured to bend in a third direction, the third direction different than the first direction, when a force is applied in the first direction; and
the connector further comprises:
a plurality of second through conductors surrounded with the insulating material, penetrating the insulating material in the first direction, and arranged in the second direction, wherein each of the second through conductors configured to bend in a forth direction, the forth direction opposite to the third direction, when the force is applied in the first direction.
2. A stacked substrate module comprising:
a connector of claim 1;
a first substrate provided on the first principal surface side of the connector and including first electrodes connected to one ends of the first through conductors of the connector; and
a second substrate provided on the second principal surface side of the connector and including second electrodes connected to the other ends of the first through conductors of the connector.
3. The connector of claim 1, wherein
the insulating material is formed of a rubber.

4. The connector of claim 1, wherein
width of the plurality of first through conductors is same as a width of a plurality of first through holes of the insulating material.

5. The connector of claim 1, wherein
a width of the plurality of first through conductors is same as a plurality of a width of a plurality of first through holes of the insulating material.

6. The connector of claim 1, wherein
each of the first through conductors is a v shape.

7. The connector of claim 1, wherein
the third direction is parallel to the second direction.

8. A connector comprising:
an insulating material; and
a plurality of first through conductors surrounded with the insulating material, penetrating the insulating material in a first direction, and arranged in a second direction perpendicular to the first direction, wherein
each of the first through conductors comprise a notch, and are configured to bend in a third direction, the third direction different than the first direction, when a force is applied in the first direction
wherein the connector further comprises
a plurality of second through conductors surrounded with the insulating material, penetrating the insulating material in the first direction, and arranged in the second direction, wherein each of the second through conductors comprises a notch and configured to bend in a forth direction, the fourth direction opposite to the third direction, when force is applied in the first direction.

9. A stacked substrate module comprising:
a connector of claim 8;
a first substrate provided on the first principal surface side of the connector and including first electrodes connected to one ends of the first through conductors of the connector; and
a second substrate provided on the second principal surface side of the connector and including second electrodes connected to the other ends of the first through conductors of the connector.

10. The connector of claim 8, wherein
the insulating material is formed of a rubber.

11. The connector of claim 8, wherein
each of the first through conductors comprises a first side and a second side opposite to the first side, the first side comprising the notch.

12. The connector of claim 8, wherein
the third direction is parallel to the second direction.

\* \* \* \* \*